(12) United States Patent
Shi et al.

(10) Patent No.: US 10,796,774 B2
(45) Date of Patent: Oct. 6, 2020

(54) METHOD AND APPARATUS FOR REFRESHING FLASH MEMORY DEVICE

(71) Applicant: HUAWEI TECHNOLOGIES CO., LTD., Shenzhen, Guangdong (CN)

(72) Inventors: Liang Shi, Chongqing (CN); Yejia Di, Chongqing (CN); Hsing Mean Sha, Chongqing (CN); Yuangang Wang, Shenzhen (CN); Dongfang Shan, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 38 days.

(21) Appl. No.: 16/120,780

(22) Filed: Sep. 4, 2018

(65) Prior Publication Data

US 2018/0374546 A1    Dec. 27, 2018

Related U.S. Application Data

(63) Continuation of application No. PCT/CN2016/075958, filed on Mar. 9, 2016.

(51) Int. Cl.
*G11C 16/34* (2006.01)
*G06F 11/10* (2006.01)
(Continued)

(52) U.S. Cl.
CPC ...... *G11C 16/3418* (2013.01); *G06F 11/1068* (2013.01); *G11C 16/0433* (2013.01);
(Continued)

(58) Field of Classification Search
CPC ......... G11C 16/10; G11C 16/14; G11C 16/26; G11C 16/349; G11C 16/0433;
(Continued)

(56) References Cited

U.S. PATENT DOCUMENTS 6,226,198 B1    5/2001 Miwa et al.
9,361,983 B2 *  6/2016 Hong ................. G11C 16/0483
(Continued)

FOREIGN PATENT DOCUMENTS

CN    1728277 A    2/2006
CN    101796497 A    8/2010
(Continued)

OTHER PUBLICATIONS

Yeong-Jae Woo et al, Diversifying Wear Index for MLC NAND Flash Memory to Extend the Lifetime of SSDs. 2013 Proceedings of the International Conference on Embedded Software (EMSOFT), Nov. 11, 2013, 10 pages.
(Continued)

*Primary Examiner* — Shelly A Chase

(57) ABSTRACT

A flash memory controller refreshes memory blocks in a flash memory device by setting different refresh cycles for individual memory blocks in the flash memory device. The flash memory controller records a number of erase operations performed on each memory block of the flash memory device. Upon detecting that a bit error rate of a memory block is greater than a preset threshold, the flash memory controller determines a refresh cycle for the memory block based on recorded number of erase operations performed on the memory block, and then refreshes the memory block according to the refresh cycle.

17 Claims, 5 Drawing Sheets

(51) Int. Cl.
  *G11C 16/04* (2006.01)
  *G11C 16/10* (2006.01)
  *G11C 16/14* (2006.01)
  *G11C 16/26* (2006.01)
  *G11C 29/52* (2006.01)
  *G11C 11/56* (2006.01)
  *H01L 29/788* (2006.01)

(52) U.S. Cl.
  CPC .............. *G11C 16/10* (2013.01); *G11C 16/14* (2013.01); *G11C 16/26* (2013.01); *G11C 16/349* (2013.01); *G11C 16/3431* (2013.01); *G11C 16/3495* (2013.01); *G11C 29/52* (2013.01); *G11C 11/5635* (2013.01); *H01L 29/788* (2013.01)

(58) Field of Classification Search
  CPC ..... G11C 29/24; G11C 29/70; G11C 16/3418; G11C 16/3431; G06F 3/0619; G06F 3/0688; G06F 11/1048; G06F 11/1068
  See application file for complete search history.

(56) References Cited

U.S. PATENT DOCUMENTS

| | | | |
|---|---|---|---|
| 2008/0068912 A1* | 3/2008 | Lee | .............. G11C 11/40622 365/222 |
| 2008/0104357 A1 | 5/2008 | Kim et al. | |
| 2008/0301525 A1 | 12/2008 | Hirose et al. | |
| 2009/0193301 A1 | 7/2009 | Ito et al. | |
| 2010/0106901 A1 | 4/2010 | Higeta et al. | |
| 2010/0332943 A1 | 12/2010 | D'Abreu et al. | |
| 2012/0163097 A1 | 6/2012 | Ishikawa et al. | |
| 2013/0007357 A1 | 1/2013 | Isaac et al. | |
| 2015/0052415 A1 | 2/2015 | Um et al. | |
| 2015/0193299 A1 | 7/2015 | Hyun et al. | |
| 2015/0288847 A1 | 10/2015 | Sakuma | |
| 2016/0005452 A1* | 1/2016 | Bae | .......................... G11C 29/24 714/764 |
| 2016/0098216 A1* | 4/2016 | Huang | ................. G06F 11/1072 714/37 |

FOREIGN PATENT DOCUMENTS

| | | |
|---|---|---|
| CN | 102194513 A | 9/2011 |
| CN | 103688311 A | 3/2014 |
| JP | 2008071490 A | 3/2008 |
| JP | 2008112445 A | 5/2008 |
| JP | 2008299621 A | 12/2008 |
| JP | 2012133642 A | 7/2012 |
| JP | 2015198377 A | 11/2015 |

OTHER PUBLICATIONS

Yangyang Pan et al, Error Rate-Based Wear-Leveling for nand Flash Memory at Highly Scaled Technology Nodes. IEEE Transactions on Very Large Scale Integration (VLSI) Systems ( vol. 21, Issue: 7, Jul. 2013 ), Sep. 4, 2012, 5 pages.

Heejin Park et al, Incremental redundancy to reduce data retention errors in flash-based SSDs. 2015 31st Symposium on Mass Storage Systems and Technologies (MSST), Aug. 20, 2015, 13 pages.

Yu Cai et al, Flash correct-and-refresh: Retention-aware error management for increased flash memory lifetime. 2012 IEEE 30th International Conference on Computer Design (ICCD), Dec. 13, 2012, 8 pages.

Yu Cai et al, Error patterns in MLC NAND flash memory: Measurement, characterization, and analysis. 2012 Design, Automation and Test in Europe Conference and Exhibition (DATE), Apr. 3, 2012, 6 pages.

* cited by examiner

METHOD AND APPARATUS FOR REFRESHING FLASH MEMORY DEVICE

CROSS-REFERENCE TO RELATED APPLICATIONS

This application is a continuation of International Application No. PCT/CN2016/075958, filed on Mar. 9, 2016, the disclosure of which is hereby incorporated by reference in its entirety.

TECHNICAL FIELD

Embodiments of the present invention relate to the computer field, and in particular, to a method and an apparatus for refreshing a flash memory device.

BACKGROUND

By virtue of advantages such as desirable random access performance, a low density, and low power consumption, a solid state drive (SSD) based on a flash memory has gradually replaced a conventional magnetic disk, and becomes an important storage medium. In recent years, flash memory technologies develop rapidly, and a storage density has developed from a single-bit flash cell to a recent multiple-bit flash cell, for example, six bits, and a manufacturing technique develops from 65 nanometers to recent 10 nanometers.

With these developments, a storage density of a flash memory increases rapidly. However, reliability of the flash memory is greatly reduced, and a retention time of the flash memory becomes increasingly short. The retention time is a length of time within which data written into the flash memory can be reliably read. In a flash memory device, data is represented by using a quantity of charges charged in a floating gate of a flash cell. However, as time elapses, a charge loss occurs. To ensure that the data in the flash cell can be reliably read, the data may be read before the charge loss of the data causes a data error, and the read data is then saved at a new location. This operation is referred to as refreshing. As a size decreases, a phenomenon of process variation (PV) among flash memory blocks becomes increasingly distinct. Flash memory blocks of a flash memory device have different levels of tolerance due to the process variation. This phenomenon is reflected by differences in many aspects such as a maximum quantity of program/erase cycles (P/E cycles) and a retention time.

Refreshing is a most direct solution to a decrease in a retention time, but refreshing also causes a redundant operation, and this operation affects performance and a life of a flash memory. In the prior art, refreshing of a flash memory cannot be flexibly and effectively regulated, and a new technology is needed to resolve the problem.

SUMMARY

In view of this, the present invention discloses a method and an apparatus for refreshing a flash memory device, so as to implement a flexible refresh operation on a flash memory device by using a granularity of per flash memory block in consideration of process variation among flash memory blocks.

According to a first aspect, this application provides a method for refreshing a flash memory device, where the method includes: reading, by a storage controller, first data from a first flash memory block, and determining a bit error rate of the first data; when the bit error rate of the first data is greater than a preset threshold, determining, by the storage controller, a refresh cycle of the first flash memory block according to a quantity of erase cycles of the first flash memory block; and performing a refresh operation on the first flash memory block according to the determined refresh cycle.

The storage controller determines whether to update a refresh cycle of a flash memory block by using a granularity of per flash memory block and according to an actual bit error rate of the data, thereby postponing update of the refresh cycle of the flash memory block to the greatest extent while correctness of the data is ensured, and reducing a speed of wear of the flash memory block because of refresh operations.

With reference to the first aspect, in a first possible implementation of the first aspect, the reading, by a storage controller, first data from a first flash memory block, and determining a bit error rate of the first data specifically includes: reading, by the storage controller, the first data from the first flash memory block, and decoding the first data by using an error-correcting code, to obtain second data; and determining the bit error rate of the first data according to the first data and the second data.

Specifically, because the second data is decoded trustworthy data, the storage controller determines the bit error rate of the first data by comparing different data bits of the first data and the second data.

With reference to any one of the first aspect or the foregoing possible implementation of the first aspect, in a second possible implementation of the first aspect, the performing, by the storage controller, a refresh operation on the first flash memory block according to the determined refresh cycle includes: when a storage time of data on any valid page in the first flash memory block reaches the refresh cycle, performing, by the storage controller, the refresh operation on the first flash memory block.

Specifically, the storage controller may record, after one refresh operation or one erase operation ends, a storage time of data on a valid page in the first flash memory block. If there is a valid page on which a storage time of data reaches the refresh cycle, the storage controller performs a refresh operation on the first flash memory block, to ensure correctness of the data.

Optionally, when a storage time of data on all valid pages in the first flash memory block is monitored, load on the storage controller is increased. The storage controller may also perform a refresh operation on the first flash memory block after a time since a last erase operation or a last refresh operation reaches the refresh cycle.

With reference to any one of the first aspect or the foregoing possible implementations of the first aspect, in a third possible implementation of the first aspect, the performing, by the storage controller, a refresh operation on the first flash memory block includes: reading, by the storage controller, third data from the first flash memory block, and decoding the third data by using an error-correcting code, to obtain fourth data; and selecting, by the storage controller, a second flash memory block from a flash memory device, and writing the fourth data into the second flash memory block.

The storage controller may use a flash memory block that has a longest refresh cycle among available flash memory blocks as the second flash memory block, thereby implementing wear leveling of the flash memory device, and prolonging a life of the flash memory device.

With reference to any one of the first aspect or the foregoing possible implementations of the first aspect, in a fourth possible implementation of the first aspect, the performing, by the storage controller, a refresh operation on the first flash memory block includes: reading, by the storage controller, third data from the first flash memory block, and decoding the third data by using an error-correcting code, to obtain fourth data; and supplementing, by the storage controller, a charge to a floating gate of a flash cell of the first flash memory block according to the fourth data.

The storage controller supplements, according to the fourth data obtained through decoding, a charge that leaks from the flash cell of the first flash memory block, so that data in the first flash memory block reaches a precise value again, and an erase operation caused on the first flash memory block by a refresh operation is avoided, and a life of the first flash memory block is prolonged.

With reference to any one of the first aspect or the foregoing possible implementations of the first aspect, in a fifth possible implementation of the first aspect, the method further includes: receiving, by the storage controller, a write access request; and determining a third flash memory block according to a refresh cycle of a flash memory block, and writing to-be-written data of the write access request into the third flash memory block, where the third flash memory block is a flash memory block that has a longest refresh cycle among available flash memory blocks.

A refresh cycle of a flash memory block represents a life of the flash memory block. Therefore, after receiving the write access request, the storage controller preferentially saves the data in a flash memory block that has a long refresh cycle, thereby implementing wear leveling of the flash memory device, and prolonging the life of the flash memory device.

With reference to any one of the first aspect or the foregoing possible implementations of the first aspect, in a sixth possible implementation of the first aspect, the method further includes: receiving, by the storage controller, a write access request; and determining a fourth flash memory block according to an expected storage time of to-be-written data of the write access request, and writing the to-be-written data into the fourth flash memory block, where there is a negative correlation between a refresh cycle of the fourth flash memory block and the expected storage time of the to-be-written data.

In a specific implementation process, the storage controller may estimate an expected storage time of data. For example, the expected storage time of the data may be distinguished according to popularity of the data. An expected storage time of hot data is relatively short, and an expected storage time of cold data is relatively long. The hot data may be stored in a flash memory block that has a long refresh cycle, and the cold data may be stored in a flash memory block that has a short refresh cycle. Hot data has relatively high update frequency, and causes frequent erase operations on a flash memory block. Therefore, the hot data is stored in a flash memory block that has a long refresh cycle, thereby implementing wear leveling of the flash memory device.

According to a second aspect, this application provides a readable medium, including an execution instruction, where when a processor of a storage controller executes the execution instruction, the storage controller performs the method in any one of the first aspect or the possible implementations of the first aspect.

According to a third aspect, this application provides a storage controller, including a processor, a memory, and a bus, where the memory is configured to store an execution instruction, the processor and the memory are connected by using the bus, and when the storage controller runs, the processor executes the execution instruction stored in the memory, so that the storage controller performs the method in any one of the first aspect or the possible implementations of the first aspect.

According to a fourth aspect, this application provides an apparatus for refreshing a flash memory device, where the apparatus includes: a reading unit, configured to: read first data from a first flash memory block, and determine a bit error rate of the first data; a determining unit, configured to: when the bit error rate is greater than a preset threshold, determine a refresh cycle of the first flash memory block according to a quantity of erase cycles of the first flash memory block; and a refresh unit, configured to perform a refresh operation on the first flash memory block according to the refresh cycle.

With reference to the fourth aspect, in a first possible implementation of the fourth aspect, the reading unit is specifically configured to: read the first data from the first flash memory block, and decode the first data by using an error-correcting code, to obtain second data; and determine the bit error rate of the first data according to the first data and the second data.

With reference to any one of the fourth aspect or the foregoing possible implementation of the fourth aspect, in a second possible implementation of the fourth aspect, that the refresh unit is configured to perform a refresh operation on the first flash memory block according to the refresh cycle includes: the refresh unit is configured to: when a storage time of data on any valid page in the first flash memory block reaches the refresh cycle, perform the refresh operation on the first flash memory block.

With reference to any one of the fourth aspect or the foregoing possible implementations of the fourth aspect, in a third possible implementation of the fourth aspect, the apparatus further includes a writing unit, where that the refresh unit is configured to perform a refresh operation on the first flash memory block includes: the refresh unit is configured to: control the reading unit to read third data from the first flash memory block, and control the reading unit to decode the third data by using an error-correcting code, to obtain fourth data; and the refresh unit is configured to: control the writing unit to select a second flash memory block from a flash memory device, and control the writing unit to write the fourth data into the second flash memory block.

With reference to any one of the fourth aspect or the foregoing possible implementations of the fourth aspect, in a fourth possible implementation of the fourth aspect, the apparatus further includes a writing unit, where that the refresh unit is configured to perform a refresh operation on the first flash memory block includes: the refresh unit is configured to: control the reading unit to read third data from the first flash memory block, and control the reading unit to decode the third data by using an error-correcting code, to obtain fourth data; and the refresh unit is configured to control the writing unit to add a charge to a floating gate of a flash cell of the first flash memory block according to the fourth data.

With reference to any one of the fourth aspect or the foregoing possible implementations of the fourth aspect, in a fifth possible implementation of the fourth aspect, the apparatus further includes a receiving unit and the writing unit, where the receiving unit is configured to receive a write access request; and the writing unit is configured to: determine a third flash memory block according to a refresh cycle of a flash memory block, and write to-be-written data of the write access request into the third flash memory block, where the third flash memory block is a flash memory block that has a longest refresh cycle among available flash memory blocks.

With reference to any one of the fourth aspect or the foregoing possible implementations of the fourth aspect, in a sixth possible implementation of the fourth aspect, the apparatus further includes a receiving unit and the writing unit, where the receiving unit is configured to receive a write access request; and the writing unit is configured to: determine a fourth flash memory block according to an expected storage time of to-be-written data of the write access request, and write the to-be-written data into the fourth flash memory block, where there is a negative correlation between a refresh cycle of the fourth flash memory block and the expected storage time of the to-be-written data.

The fourth aspect is an apparatus implementation corresponding to the method in the first aspect. Therefore, the description in any one of the first aspect or the possible implementations of the first aspect is correspondingly applicable to any one of the fourth aspect or the possible implementations of the fourth aspect. Details are not described herein again.

According to a fifth aspect, this application provides a flash memory device, where the flash memory device includes a flash memory array and the refresh apparatus according to any one of the fourth aspect or the possible implementations of the fourth aspect, where the flash memory array is configured to store data, and the refresh apparatus is configured to perform a refresh operation on a flash memory block in the flash array.

According to the technical solutions disclosed in the present invention, in consideration of process variation among flash memory blocks of a flash memory device, an actual bit error rate of a flash memory block is monitored, thereby exploiting performance potential of the flash memory block to the greatest extent. Not only correctness of stored data is ensured, but also update of a refresh cycle is postponed to the greatest extent. A speed of wear of the flash memory block because of refresh operations is reduced, thereby improving overall performance of the flash memory device.

BRIEF DESCRIPTION OF DRAWINGS

To describe the technical solutions in the embodiments of the present invention more clearly, the following briefly describes the accompanying drawings required for describing the embodiments. Apparently, the accompanying drawings in the following description show merely some embodiments of the present invention, and persons of ordinary skill in the art may still derive other drawings from these accompanying drawings without creative efforts.

DESCRIPTION OF EMBODIMENTS

The following describes the embodiments of the present invention with reference to the accompanying drawings.

According to the embodiments of the present invention, if process variation among flash memory blocks is not considered, when a refresh operation is performed on a flash memory device, all flash memory blocks are refreshed at same frequency. However, process variation exists among different flash memory blocks. Some flash memory block has relatively high performance, charge leakage of a flash cell inside the flash memory block is indistinct, and a retention time of data is relatively long. Therefore, the flash memory block may be refreshed by using a relatively long refresh cycle. However, some flash memory block has relatively low performance, charge leakage of a flash cell inside the flash memory block is distinct, and a retention time of data is relatively short. Therefore, the flash memory block should be refreshed by using a relatively short refresh cycle.

If process variation is not considered, and a refresh operation is performed on a flash memory device by using same frequency. On one hand, performance of a flash memory block that has relatively high performance is not fully exploited, and excessively frequent refresh operations may increase a speed of wear of the flash memory block. On the other hand, a data error may occur in a data block that has relatively low performance, because the data block that has relatively low performance needs lower refresh frequency. In consideration of process variation among different flash memory blocks, performance of a flash memory device can be further improved by performing a refresh operation on the flash memory device by using a granularity of per flash memory block and by using different frequency.

Figure 1:
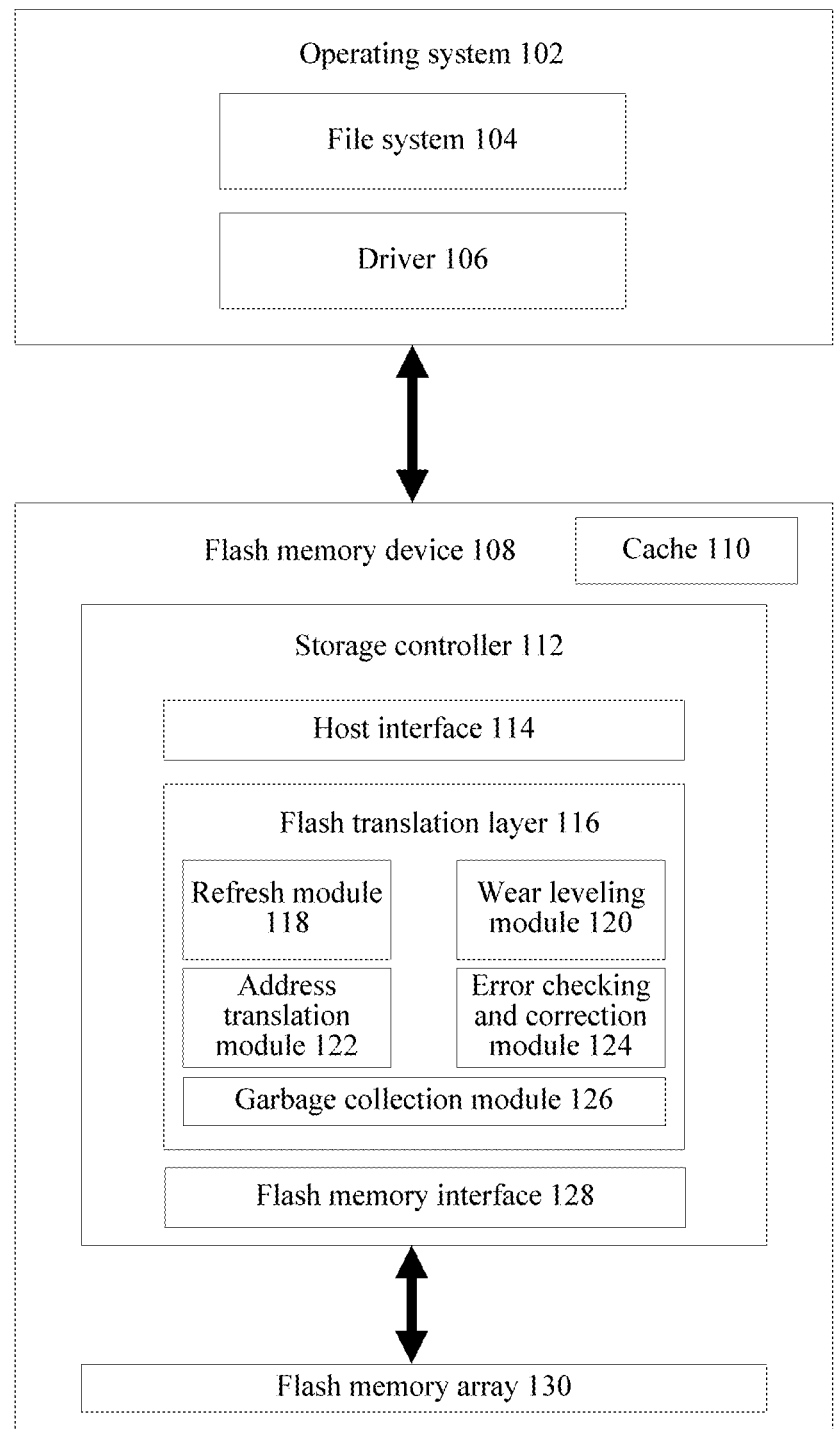
FIG. 1 is a schematic diagram of a logical structure of a system for accessing a flash memory device according to an embodiment of the present invention.

FIG. 1 is a schematic diagram 100 of a logical structure of a system for accessing a flash memory device according to an embodiment of the present invention. As shown in FIG. 1, the system 100 includes an operating system 102 and a flash memory device 108.

The operating system 102 includes various software components and/or drivers that are used to control and manage routine system tasks (for example, memory management, storage device control, and power management) and facilitate communication among various software and hardware components. The operating system 102 may be Darwin, RTXC, LINUX, UNIX, OS X, MAC OS, or WINDOWS, or an embedded operating system such as Vxworks. This is not limited in this embodiment of the present invention.

Specifically, the operating system 102 includes a file system 104 and a driver 106. The file system 104 is a method and a data structure that are used by the operating system 102 to specify files on the flash memory device 108, that is, a method for organizing files on the flash memory device 108. The file system 104 may be of any type such as FAT, NTFS, exFAT, RAW, Ext2, Ext3, Ext4, Btrfs, ZFS, HFS, HFS+, ReiserFS, JFS, VMFS, XFSUFS, or VXFS.

An application program of a user runs in the operating system 102. The application program implements human-machine interaction in a form of accessing underlying hardware. The driver 106 is a bridge for interaction between the application program and the hardware. On one hand, the application program controls the hardware by sending a corresponding instruction to the driver 106. On the other hand, the driver 106 transfers, to the application program, read and write statuses of the hardware and data obtained from the hardware, thereby implementing interaction between the application program and the underlying hardware.

The operating system 102 is connected to the flash memory device 108 by using an advanced technology attachment apparatus (ATA).

The flash memory device 108 is a storage device based on a flash memory, for example, may be an SSD. The flash memory device 108 includes a cache 110, a storage controller 112, and a flash memory array 130.

The storage controller 112 includes a host interface 114, a flash translation layer (FTL) 116, and a flash memory interface 128.

The host interface 114 is configured to connect to a host, and control data transmission with the operating system 102.

The flash memory interface 128 is configured to connect to the flash memory array 130, and control data transmission with the flash memory array 130.

The flash translation layer 116 includes a refresh module 118, a wear leveling (WL) module 120, an address translation module 122, an error checking and correction (ECC) module 124, and a garbage collection (GC) module 126.

The flash memory array 130 may be divided into multiple blocks, and each block may further be divided into multiple pages. Data may be directly written on a per-page basis. However, data needs to be erased on a per-block basis. New data cannot be written before existing data is erased. However, the operating system 102 generally reads and writes data according to a size of a sector of a hard disk drive (HDD). As a result, an SSD cannot be managed by using the file system 104 currently used by the operating system 102, and the file system 104 needs to be replaced with a more advanced and complex file system to resolve this problem. However, in this case, load on the operating system 102 is increased. To avoid increasing the load on the operating system 102, the flash memory device 108 uses software to virtualize an operation on the flash memory array 130 into an operation on an independent sector of a magnetic disk. This is a function of the flash translation layer 116.

The flash translation layer 116 exists between the file system 104 and a physical medium (the flash memory array 130). The operating system 102 only needs to operate a logical block address (LBA) in an original way. The flash translation layer 116 is responsible for all work of translation from a logical address into a physical block address (PBA).

The refresh module 118 is configured to perform a refresh operation on a flash memory block. Data is represented in a flash cell of a flash memory by using a quantity of charges charged in a floating gate. However, as time elapses, a charge loss occurs in the floating gate. As a result, the data stored in the flash cell is inaccurate. To enable the data to be accurately read subsequently, the refresh module 118 refreshes the flash memory block before the charge loss in the floating gate of the flash cell causes a data error.

Specifically, in this embodiment of the present invention, a refresh operation of the refresh module 118 may be reading the data in the flash memory block and writing the data at a new location; or may be reading the data in the flash memory block and locally charging the flash cell of the flash memory block according to the read data, so that the quantity of charges in the floating gate of the flash cell reaches an accurate quantity of charges again. More specifically, after reading the data in the flash memory block, ECC checking may further be performed on the read data, and a result obtained after the ECC checking is written at a new location, or the flash cell is locally charged according to the result obtained after the ECC checking.

A life of the flash memory array 130 is calculated according to a quantity of program/erase cycles, and the wear leveling module 120 is a mechanism ensuring that flash memory blocks in the flash memory array 130 are used in a balanced manner. Without this mechanism, the flash memory blocks in the flash memory array 130 cannot reach a lifecycle at the same time. Data of a user in logical address space has different update speeds. Some data needs to be frequently updated, and some data does not need to be changed for a long time. Therefore, without the WL mechanism, a life of a flash memory block in which the frequently updated data is located ends first, and a flash memory block in which the relatively infrequently changed data is located has far less wear. To avoid this situation, the WL mechanism is needed to keep relatively equal wear degrees of flash memory blocks in the flash memory array 130.

Specifically, the wear leveling module 120 works together with the address translation module 122. Each time an application program in the operating system 102 rewrites or updates a same logical address, the address translation module 122 dynamically maps the logical address to another different physical address, and saves the mapping relationship in a specific "address mapping table". An outdated physical address is marked as "invalid", and waits for a subsequent erase operation. The wear leveling module 120 controls program/erase frequency of each flash memory chip in this mapping process. In this way, all flash memory blocks can be controlled to be within a same wear range, and "age" at the same time.

The error checking and correction module 124 is configured to detect and correct an error during data reading. When data is written, the error checking and correction module 124 inside the storage controller 112 generates an ECC signature according to the data. The ECC signature is generally stored in a spare area (SA) in the back of a flash memory page. When the data is read from the flash memory page, the error checking and correction module 124 reads the ECC signature, and determines, according to the read data and the ECC signature, whether an error occurs in the data. If it is detected that the read data includes an erroneous bit, the detected error needs to be corrected by using an ECC algorithm. The ECC algorithm may be BCH encoding, LDPC encoding, or the like. The LDPC encoding is used to describe solutions in this embodiment of the present invention. However, it should be understood that an encoding algorithm used for ECC is not limited in this embodiment of the present invention.

The garbage collection module 126 is specifically configured to copy data on a "valid" page in a flash memory block to another flash memory block, and completely erase the data in the former flash memory block. Different from a conventional HDD, original data cannot be directly overwritten in the flash memory array 130. In the flash memory device 108, old data needs to be erased before new data can be written. For the flash memory array 130, garbage collection refers to a process in which existing data is moved to another flash memory location and some useless data is completely erased. Data may be directly written into the flash memory array 130 on a per-page basis, but data needs to be erased from the flash memory array 130 on a per-block basis. Therefore, to erase useless data, in the flash memory array 130, first, useful data included in a block needs to be copied to a page in another block. In this way, useless data included in the original block can be erased on a per-block basis. The erase needs to be performed before new data can be written.

The cache 110 is configured to store data such as an "address mapping table" that is about a mapping from a logical address to a physical address during start. The storage controller 112 saves the "address mapping table" and the like in the flash memory array 130. After each restart, the storage controller 112 loads the data such as the "address mapping table" to the cache 110 from the flash memory array 130. According to an embodiment of the present invention, the storage controller 112 maintains a refresh cycle of a flash memory block in the flash memory array 130. Specifically, the storage controller may save the refresh cycle of the flash memory block by using a refresh cycle table. The refresh cycle table includes a correspondence between a physical address and the refresh cycle of the flash memory block. The storage controller may save the refresh cycle table in the flash memory array 130. After each start, the storage controller loads the refresh cycle table to the cache 110 from the flash memory array 130.

The flash memory array 130 may use a single-level cell (SLC) or a multi-level cell (MLC). Each SLC cell stores information of one bit, and each MLC cell may store data of more than one bit. This is not limited in this embodiment of the present invention.

It should be understood that FIG. 1 is only for a purpose of introducing participants of the system 100 and relationships among the participants as an example. Therefore, the described system 100 is greatly simplified. The system 100 is only generally described in this embodiment of the present invention. In actual use, the system 100 may include more or fewer components. An implementation of the system 100 is not limited in any way in this embodiment of the present invention.

Figure 2:
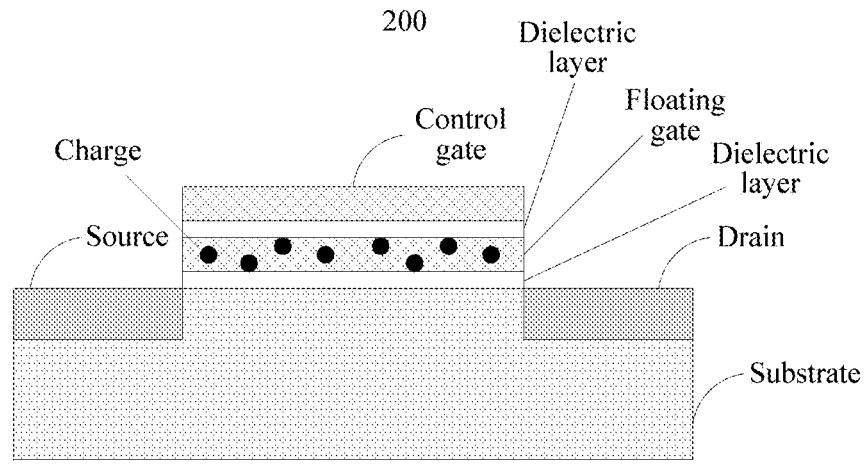
FIG. 2 is a schematic structural diagram of a flash cell of a flash memory according to an embodiment of the present invention.

FIG. 2 is a schematic structural diagram of a flash cell 200 according to an embodiment of the present invention. As shown in FIG. 2, data is stored in a flash cell of a flash memory in the form of a charge, and different data states are distinguished in the flash cell by using a charge quantity of electrons in a floating gate. A quantity of stored charges depends on a voltage applied to a control gate in FIG. 2. The control gate controls a quantity of charges charged in the floating gate of the flash cell. Data is represented by determining whether a voltage provided by the charges stored in the floating gate exceeds a specific threshold Vth.

An SLC is used as an example. A write (programming) on the flash memory is applying a voltage to a control gate, so that the charges stored in the floating gate are sufficient, and the provided voltage exceeds a threshold Vth. This case is represented by "0". An erase operation on the flash memory is discharging the charges in the floating gate, so that the voltage provided by the floating gate is less than the threshold Vth. This case is represented by "1". For a flash cell that has a charge in a floating gate, due to an induction effect of the floating gate, a positive space charge region is formed between a source and a drain. In this case, regardless of whether a bias voltage is applied to a control gate, a transistor that is used as the flash cell is in an on state. For a flash cell that does not have a charge in a floating gate, an appropriate bias voltage needs to be applied to a control gate to form a positive space charge region between a source and a drain and to form a conducting channel between the source and the drain. When a bias voltage is not applied to the control gate, a transistor is in an off state.

If the source of the transistor is grounded and the drain of the transistor is connected to a bit line, without a bias voltage, data in the flash cell can be obtained by detecting a conduction status of the transistor. If a level on the bit line is low, it indicates that the transistor is in an on state, and read data is "0". If the level on the bit line is a high level, it indicates that the transistor is in an off state, and read data is "1".

It should be understood that FIG. 2 is used as an example for describing the flash cell. In a specific implementation, a structure of the flash cell may have another implementation form. This is not limited in this embodiment of the present invention.

Figure 3:
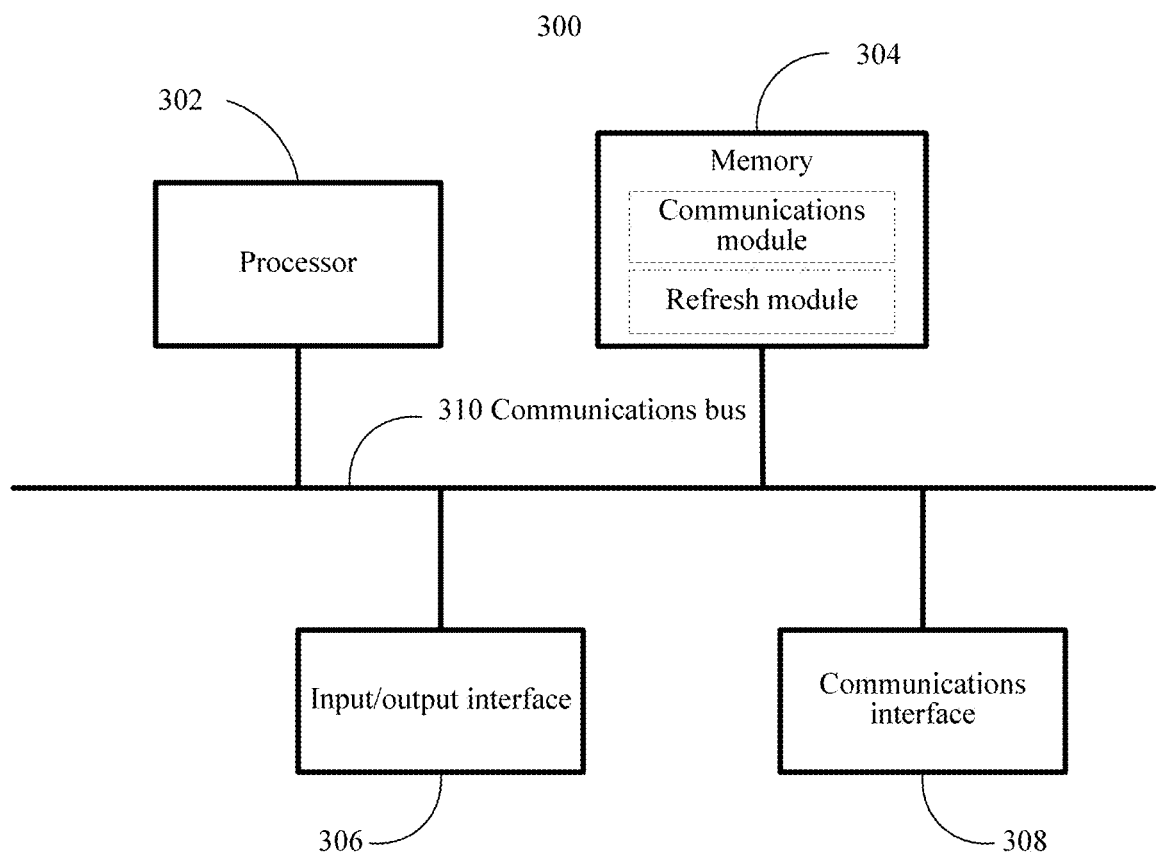
FIG. 3 is a schematic diagram of a hardware structure of a storage controller according to an embodiment of the present invention.

FIG. 3 is a schematic diagram of a hardware structure of a storage controller 300 according to an embodiment of the present invention. As shown in FIG. 3, the storage controller 300 includes a processor 302, a memory 304, an input/output interface 306, a communications interface 308, and a bus 310. The processor 302, the memory 304, the input/output interface 306, and the communications interface 308 communicate with and connect to each other by using the bus 310.

The processor 302 is a control center of the storage controller 300, and is configured to execute a related program to implement the technical solution provided in this embodiment of the present invention. The processor 302 may be a general-purpose central processing unit (CPU), a microprocessor, an application-specific integrated circuit (ASIC), or one or more integrated circuits, so as to execute a related program to implement the technical solution provided in this embodiment of the present invention.

Unless otherwise specified, in the present invention, a component configured to execute a specific function, for example, the processor 302 or the memory 304 may be implemented by configuring a universal component to perform the corresponding function, or may be implemented by using a dedicated component specially executing the specific function. This is not limited in this application.

The memory 304 may be a read-only memory (ROM), a static storage device, a dynamic storage device, or a random access memory (RAM). The memory 304 may store an operating system and another application program. When implementing the technical solution provided in this embodiment of the present invention by means of software or firmware, program code for implementing the technical solution provided in this embodiment of the present invention is stored in the memory 304 and is executed by the processor 302. The memory 304 may be integrated with the processor 302 or integrated inside the processor 302, or may be one or more storage units independent of the processor 302.

The program code to be executed by the processor 302 may be stored in a flash memory or the memory 304 connected to the processor 302. Optionally, the memory 304 is a RAM, and the program code (for example, a communications module or a refresh module) stored inside the flash memory is copied to the memory 304 for execution by the processor 302.

The memory 304 may further be configured to store an address mapping table or the like in this embodiment of the present invention. More specifically, when a system is started, the storage controller 300 loads an address mapping table or the like stored in the flash memory to the memory 304 for use by the processor 302.

As shown in FIG. 3, the memory 304 of the storage controller 300 includes a refresh module. The processor 302 executes program code of the refresh module, to implement a refresh operation on a flash memory device.

Optionally, the memory 304 further includes one or more of the wear leveling module 130, the address translation module 122, the error checking and correction module 124, or the garbage collection module 126 in the storage controller 112 in FIG. 1.

The input/output interface 306 is configured to: receive data and information that are input, and output data such as an operation result.

The communications interface 308 uses, for example, but without limitation to, a transceiver apparatus such as a transceiver, to implement communication between the storage controller 300 and another device or a communications network.

The bus 310 may include a path for transferring information among the components (for example, the processor 302, the memory 304, the input/output interface 306, and the communications interface 308) of the storage controller 300.

It should be noted that, although only the processor 302, the memory 304, the input/output interface 306, the communications interface 308, and the bus 310 are shown for the storage controller 300 shown in FIG. 3, in a specific implementation process, persons skilled in the art should understand that, the storage controller 300 further includes another device essential for normal operation. In addition, according to a specific requirement, persons skilled in the art should understand that the storage controller 300 may further include a hardware device for implementing another additional function. In addition, persons skilled in the art should understand that, the storage controller 300 may also include only a device essential for implementing this embodiment of the present invention, rather than all the devices shown in FIG. 3.

The hardware structure shown in FIG. 3 and the foregoing description are applicable to various apparatuses and systems for refreshing a flash memory device provided in the embodiments of the present invention, and are suitable for performing various methods for refreshing a flash memory device provided in the embodiments of the present invention.

Figure 4:
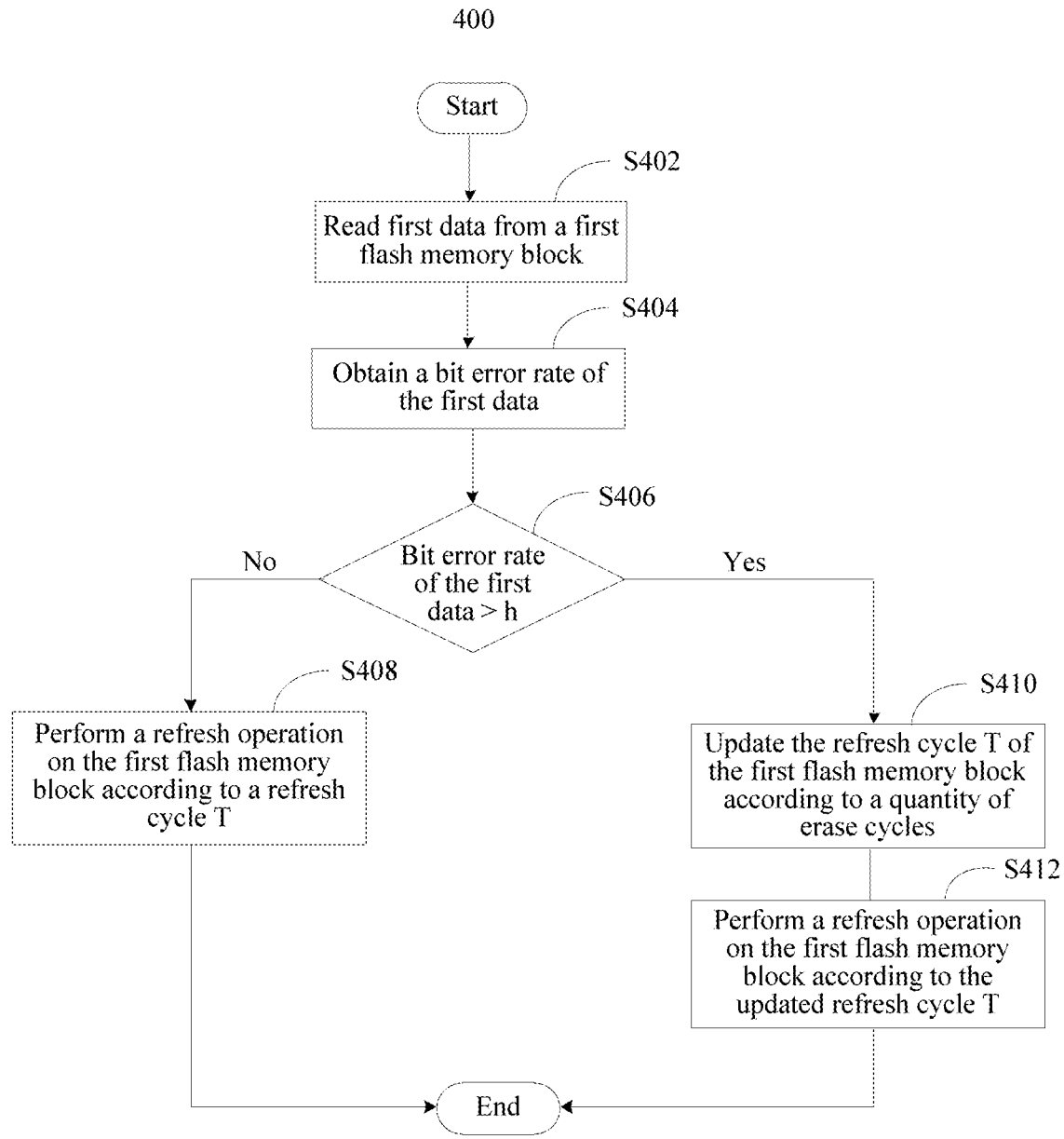
FIG. 4 is an example of a flowchart of a method for refreshing a flash memory device according to an embodiment of the present invention.

FIG. 4 shows a method 400 for refreshing a flash memory device according to an embodiment of the present invention, so as to implement a refresh operation on a flash memory device by using a granularity of per flash memory block. As shown in FIG. 4, the method 400 includes the following steps.

S402. A storage controller reads first data from a first flash memory block.

The first data may be data on any valid page in the first flash memory block, or may be data on one or more valid pages in the first flash memory block, or may be data on all valid pages in the first flash memory block. This is not limited in this embodiment of the present invention. The valid page herein is a flash memory page on which valid data is stored.

The method 400 may be triggered by any read operation that is performed by the storage controller on the first flash memory block. A form of the read operation is not limited in this embodiment of the present invention. For example, the method 400 may be triggered by a read operation of an operating system, or the method 400 may be triggered by a read operation that is performed when the storage controller performs garbage collection on the flash memory device, or the method 400 may be triggered by a read operation that is performed when the storage controller performs a refresh operation on the flash memory device.

S404. The storage controller obtains a bit error rate of the first data.

Specifically, after reading the first data from the first flash memory block, the storage controller decodes the read first data by using an ECC, to obtain second data, and determines the bit error rate of the first data according to the first data and the second data.

For example, if a size of the first data is 100 bits, after decoding using an ECC succeeds, the first data and the second data are compared. If there are 10 different bits between the second data and the first data, because the second data is data obtained after decoding using an ECC succeeds, it indicates that 10 bits are erroneous in the first data. Therefore, the bit error rate of the first data is 10%.

ECC may be LDPC, BCH, or the like. A specific type of ECC is not limited in this embodiment of the present invention.

S406. The storage controller determines whether the bit error rate of the first data is greater than a preset threshold h; if the bit error rate is greater than the threshold h, the storage controller performs step S410; if the bit error rate is not greater than the threshold h, the storage controller performs step S408.

Specifically, the preset threshold h is a threshold that is set in advance for a bit error rate of a flash memory block. If a bit error rate of data is greater than the threshold h, it indicates that a risk that data in the flash memory block is erroneous is relatively high, and a refresh cycle should be adjusted to control the bit error rate of the flash memory block to be not greater than the threshold h.

S408. The storage controller performs a refresh operation on the first flash memory block according to a refresh cycle T.

Because the bit error rate of the first data is not greater than the threshold h, it indicates that a current refresh cycle of the first flash memory block is still usable, a risk that the data is erroneous is still within a controllable range, and it can be ensured that the data can be successfully decoded using ECC during a read operation. Before a bit error rate of data stored in the first flash memory block reaches the threshold h, the refresh cycle does not need to be updated, thereby exploiting performance potential of the first flash memory block, reducing frequency of refresh operations on the first flash memory block, reducing a speed of wear of the first flash memory block because of refresh operations, and prolonging a life of the first flash memory block.

The storage controller may perform a refresh operation on the first flash memory block when a storage time of data on any valid page in the first flash memory block reaches the refresh cycle T. Specifically, the storage controller may record, after one refresh operation or one erase operation ends, a storage time of data on a valid page in the first flash memory block. If there is a valid page on which a storage time of data reaches the refresh cycle T, the storage controller performs a refresh operation on the first flash memory block, to ensure correctness of the data.

When a storage time of data on all valid pages in the first flash memory block is monitored, load on the storage controller is increased. In another implementation, the storage controller may perform a refresh operation on the first flash memory block after a time since a last erase operation or a last refresh operation reaches the refresh cycle T.

In this embodiment of the present invention, the refresh operation may be: reading, by the storage controller, third data from the first flash memory block, decoding the third data by using an error-correcting code, to obtain fourth data, selecting a second flash memory block from the flash memory device, and writing the fourth data into the second flash memory block. The third data may be all valid data in the first flash memory block, or may be valid data of which a storage time reaches the refresh cycle T and that is in the first flash memory block, that is, valid data that actually needs a refresh operation.

The storage controller may select a flash memory block that has a longest refresh cycle among available flash memory blocks as the second flash memory block, thereby implementing wear leveling of the flash memory device, and prolonging a life of the flash memory device. The storage controller may also use another manner to select the second flash memory block. A manner in which the storage controller selects the second flash memory block is not limited in this embodiment of the present invention.

The refresh operation may also be: reading, by the storage controller, third data from the first flash memory block, decoding the third data using an error-correcting code, to obtain fourth data, and supplementing a charge to a floating gate of a flash cell of the first flash memory block according to the fourth data. That is, the storage controller supplements, according to the fourth data obtained after decoding using an ECC, a charge that leaks from the flash cell inside the first flash memory block, so that a quantity of charges in the floating gate of the flash cell reaches an accurate quantity of charges again.

S410. The storage controller updates the refresh cycle T of the first flash memory block according to a quantity of erase cycles.

The storage controller maintains refresh cycles of flash memory blocks of the flash memory device. Specifically, the storage controller may organize the refresh cycles of the flash memory blocks into a refresh cycle table. The refresh cycle table stores correspondences between physical addresses and the refresh cycles of the flash memory blocks. The storage controller may save the refresh cycle table in the flash memory device, and when the system runs, load the refresh cycle table stored in the flash memory device to a cache of the storage controller. When the bit error rate of the first flash memory block is greater than the preset threshold h, the storage controller may find the refresh cycle of the first flash memory block by searching the refresh cycle table according to a physical address of the first flash memory block, and update the refresh cycle T of the first flash memory block. It should be understood that the refresh cycle table is merely an example for description. A manner in which the storage controller maintains the refresh cycle of the first flash memory block is not limited in this embodiment of the present invention.

Because the bit error rate of the first data is already greater than the preset threshold h, it indicates that correctness of the data in the first flash memory block can no longer be ensured by using the refresh cycle of the first flash memory block, and refresh frequency of the first flash memory block needs to be increased. Therefore, the storage controller determines the refresh cycle T of the first flash memory block again according to the quantity of erase cycles of the first flash memory block, that is, updates the refresh cycle T of the first flash memory block according to the quantity of erase cycles of the first flash memory block.

A factor affecting a retention time of a flash memory block is mainly a quantity of erase cycles of the flash memory block. As the quantity of erase cycles increases, the retention time of the flash memory block gradually decreases. The retention time of the flash memory block determines a refresh cycle of the flash memory block. When the retention time of the flash memory block is shorter, to ensure correctness of data, the refresh cycle is shorter. When the retention time is longer, the refresh cycle may be longer.

There is a general correspondence between a refresh cycle and a quantity of erase cycles of the flash memory device. As shown in formula (1), when the quantity of erase cycles is larger, the refresh cycle is shorter. There is a negative correlation between the refresh cycle and the quantity of erase cycles.

$$T = \frac{RBERth}{M * 10^{-13} * C} + N \qquad \text{(Formula 1)}$$

M and N are constants, RBERth is a maximum bit error rate supported by ECC, and C is a quantity of erase cycles of a flash memory block. It should be understood that formula (1) is merely an example for describing the correspondence. Specific correspondences between a refresh cycle and a quantity of erase cycles may be different according to different manufacture processes of the flash memory device.

The correspondence may be obtained through testing and according to statistics. A refresh cycle may be obtained according to the correspondence and a quantity of erase cycles. To ensure the correctness of the data stored in the flash memory block and avoid frequent update of the refresh cycle, the refresh cycle obtained according to the correspondence is a conservative value. That is, the refresh cycle obtained according to the correspondence is shorter than a refresh cycle actually supported by the flash memory block. Therefore, the refresh cycle determined according to the correspondence may be used by the flash memory block for a period of time, until a bit error rate of the flash memory block is greater than the preset threshold h. At this time, a refresh cycle needs to be determined again according to a quantity of erase cycles and the correspondence. The refresh cycle actually supported by the flash memory block is a maximum refresh cycle that ensures that the bit error rate of the flash memory block is not greater than the threshold h.

Because process variation exists among flash memory blocks of the flash memory device, there is a difference between a general value obtained according to the correspondence and a refresh cycle actually supported by a flash memory block. Some flash memory block has relatively high performance, charge leakage of a flash cell inside the flash memory block is indistinct, and a retention time of data is relatively long. After a refresh cycle is updated, it is possible that after a large quantity of erase operations, a refresh cycle actually supported by the flash memory block is still longer than a refresh cycle obtained according to the correspondence, and the refresh cycle obtained according to the correspondence is used for a relatively long time. To reduce frequency of refresh operations, the refresh cycle may be updated less frequently. However, some flash memory block has relatively low performance, charge leakage of a flash cell inside the flash memory block is distinct, and a retention time of data is relatively short. After a refresh cycle is updated, it is possible that after a small quantity of erase operations, a refresh cycle actually supported by the flash memory block quickly becomes less than the general value obtained according to the correspondence, and the refresh cycle obtained according to the correspondence is used for a relatively short time. To ensure correctness of the data, the refresh cycle needs to be frequently updated.

In this embodiment of the present invention, in consideration of process variation among different flash memory blocks, when correctness of data stored in a flash memory block is ensured, performance potential of the flash memory block is exploited by using a granularity of per flash memory block, according to a correspondence between a refresh cycle and a quantity of erase cycles, and with reference to an actual bit error rate of the data stored in the flash memory block.

On one hand, by means of the technical solution disclosed in this embodiment of the present invention, update of a refresh cycle of a flash memory block that has relatively high performance is postponed, thereby reducing a speed of wear of the flash memory block that has relatively high performance because of refresh operations. On the other hand, by means of the technical solution disclosed in this embodiment of the present invention, update of a refresh cycle of a flash memory block that has relatively low performance is performed more often, thereby ensuring correctness of data stored in the flash memory block. According to the technical solution disclosed in this embodiment of the present invention, not only correctness of data stored in a flash memory device is ensured, but also performance potential of the flash memory device is exploited. A speed of wear of the flash memory device because of refresh operations is reduced, thereby improving overall performance of the flash memory device.

S412. The storage controller performs a refresh operation on the first flash memory block according to the updated refresh cycle T.

For a specific description, refer to step S408, and details are not described herein again.

Optionally, the method 400 further includes: receiving, by the storage controller, a write access request; and determining a third flash memory block according to a refresh cycle of a flash memory block, where the third flash memory block is a flash memory block that has a longest refresh cycle among available flash memory blocks, and writing, by the storage controller, to-be-written data of the write access request into the third flash memory block. A flash memory block cannot be overwritten, and an erase operation needs to be performed before a write operation can be performed. The currently available flash memory block is a flash memory block on which a write operation can be performed after an erase operation.

One write access request may be sent to the storage controller by using multiple instructions. For example, during one write access request, the operating system may first send a virtual address at which a write operation is to be performed to the storage controller. The storage controller determines, according to a currently available flash memory block, a physical address at which a write operation is to be performed, and establishes a mapping relationship between the virtual address at which a write is to be performed and the physical address at which a write is to be performed. The operating system then sends to-be-written data to the storage controller, and the storage controller writes the to-be-written data into a storage area indicated by the determined physical address. The operating system may also send the to-be-written data and the virtual address at which a write is to be performed to the storage controller by using one instruction. It should be understood that a specific implementation form of the write access request is not limited in this embodiment of the present invention.

A refresh cycle is essentially determined by a retention time of a flash memory block. Therefore, the determining, by the storage controller, a third flash memory block according to a refresh cycle of a flash memory block may be specifically: determining, by the storage controller, the third flash memory block according to a retention time of the flash memory block.

A refresh cycle (or a retention time) of a flash memory block represents a life of the flash memory block. Therefore, after receiving the write access request, the storage controller preferentially saves the data in a flash memory block that has a long refresh cycle (or retention time), thereby implementing wear leveling of the flash memory device, and prolonging a life of the flash memory device.

Optionally, the method 400 further includes: receiving, by the storage controller, a write access request; and determining a fourth flash memory block according to an expected storage time of to-be-written data of the write access request, where there is a negative correlation between a refresh cycle of the fourth flash memory block and the expected storage time of the to-be-written data; and writing, by the storage controller, the to-be-written data into the fourth flash memory block. The expected storage time is a time for which the to-be-written data is to be stored in the flash memory device.

In a specific implementation process, the storage controller may estimate an expected storage time of data. For example, the expected storage time of the data may be distinguished according to popularity of the data. An expected storage time of hot data is relatively short, and an expected storage time of cold data is relatively long. The hot data may be stored in a flash memory block that has a long refresh cycle, and the cold data may be stored in a flash memory block that has a short refresh cycle.

A flash memory cannot be overwritten, and an erase operation needs to be performed before a write operation can be performed. Therefore, update of data causes an erase operation, and consequently causes wear of a flash memory block. Hot data has relatively high update frequency, and causes frequent erase operations on a flash memory block. Therefore, the hot data is stored in a flash memory block that has a long refresh cycle, thereby implementing wear leveling of the flash memory device. According to the technical solution disclosed in this embodiment of the present invention, in consideration of process variation among flash memory blocks of a flash memory device, an actual bit error rate of a flash memory block is monitored, thereby exploiting performance potential of the flash memory block to the greatest extent. Not only correctness of stored data is ensured, but also update of a refresh cycle is postponed to the greatest extent. A speed of wear of the flash memory block because of refresh operations is reduced, thereby improving overall performance of the flash memory device.

Figure 5:
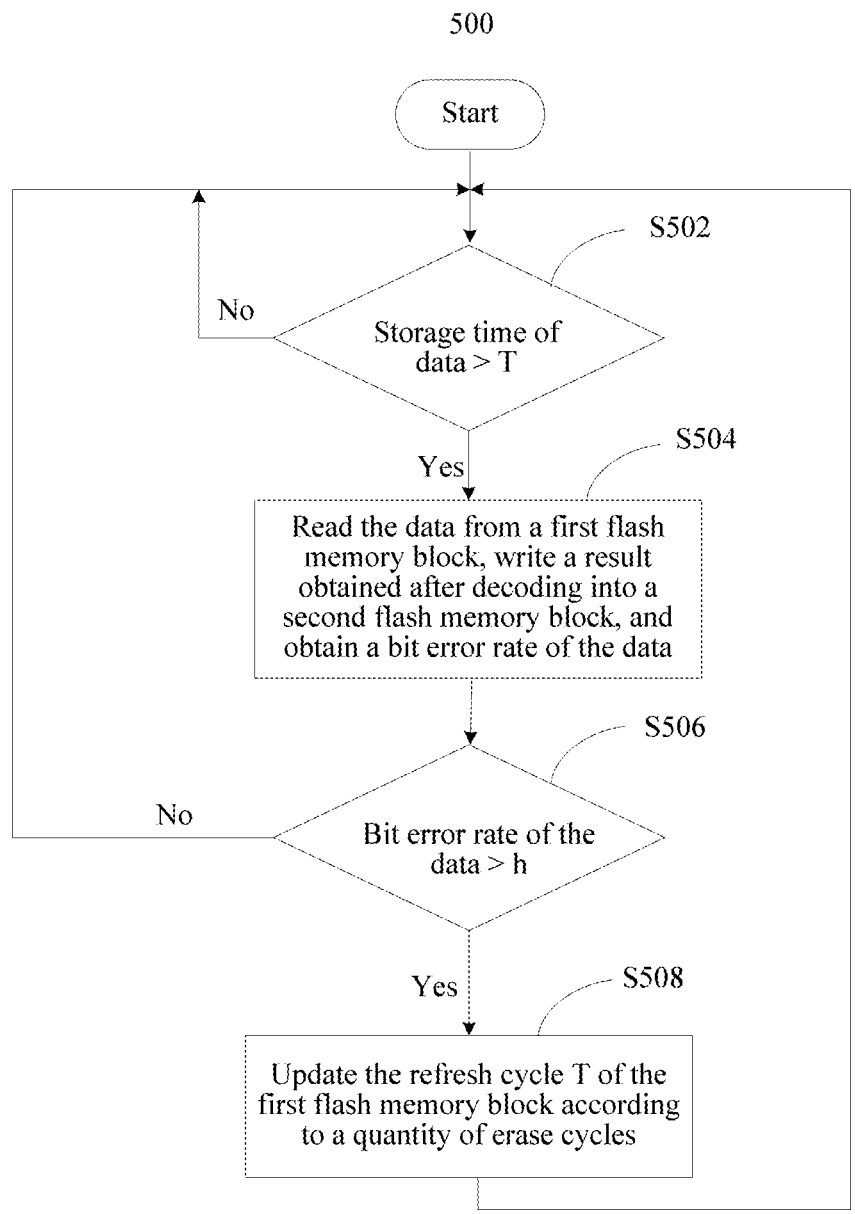
FIG. 5 is an example of a flowchart of a method for refreshing a flash memory device according to an embodiment of the present invention.

FIG. 5 shows a method 500 for refreshing a flash memory device according to an embodiment of the present invention, so as to implement a refresh operation on a flash memory device by using a granularity of per flash memory block. As shown in FIG. 5, the method 500 includes the following steps.

S502. A storage controller determines whether a storage time of data in a first flash memory block is longer than a refresh cycle T; if the storage time of the data is longer than the refresh cycle T, the storage controller performs step S504.

The storage controller may perform step S504 when a storage time of data on any valid page in the first flash memory block reaches the refresh cycle T. Specifically, the storage controller may record, after one refresh operation or one erase operation ends, a storage time of data on a valid page in the first flash memory block. If there is a valid page on which a storage time of data reaches the refresh cycle T, the storage controller performs step S504.

When a storage time of data on all valid pages in the first flash memory block is monitored, load on the storage controller may be increased. In another implementation, the storage controller may perform step S504 after a time since a last erase operation or a last refresh operation reaches the refresh cycle T.

S504. The storage controller reads the data from the first flash memory block, writes a result obtained after decoding into a second flash memory block, and obtains a bit error rate of the data.

Specifically, the storage controller reads third data from the first flash memory block, decodes the third data by using an error-correcting code, to obtain fourth data, selects the second flash memory block from the flash memory device, writes the fourth data into the second flash memory block, and determines a bit error rate of the third data according to the third data and the fourth data. The third data may be all valid data in the first flash memory block.

In another implementation, step S504 may be: reading, by the storage controller, third data from the first flash memory block, decoding the third data by using an error-correcting code, to obtain fourth data, and supplementing a charge to a floating gate of a flash cell of the first flash memory block according to the fourth data. That is, the storage controller supplements, according to the fourth data obtained after decoding using an ECC, a charge that leaks from the flash cell inside the first flash memory block, so that a quantity of charges in the floating gate of the flash cell reaches an accurate quantity of charges again. A bit error rate of the third data is then determined according to the third data and the fourth data.

S506. The storage controller determines whether the bit error rate of the data is greater than a preset threshold h; if the bit error rate of the data is greater than the preset threshold h, the storage controller performs step S508; if the bit error rate of the data is not greater than the preset threshold h, the storage controller keeps the refresh cycle T of the first flash memory block unchanged.

For a specific description, refer to step S406, and details are not described herein again.

S508. The storage controller determines and updates the refresh cycle T of the first flash memory block according to a quantity of erase cycles of the first flash memory block.

For a specific description, refer to step S410, and details are not described herein again.

It should be understood that the embodiment in FIG. 5 is a specific implementation of the embodiment shown in FIG. 4, the feature description in the embodiment in FIG. 4 is applicable to the embodiment in FIG. 5, and details are not described herein again.

According to the technical solution disclosed in this embodiment of the present invention, by using a granularity of per flash memory block, each time when a refresh operation is performed, whether a bit error rate of data is greater than a preset threshold h is determined. If the bit error rate is greater than the preset threshold h, it indicates that correctness of data stored in a flash memory block can no longer be ensured by using a refresh cycle of the flash memory block, and a refresh cycle is determined again according to a quantity of erase cycles. If the bit error rate of the data is not greater than the preset threshold h, it indicates that correctness of data stored in a flash memory block can still be ensured by using a current refresh cycle, and the current refresh cycle may still be kept unchanged. In this way, maximum performance potential of the flash memory block is exploited, frequency of refresh operations on the flash memory block is reduced to the greatest extent, and a speed of wear of the flash memory block because of refresh operations is reduced.

Figure 6:
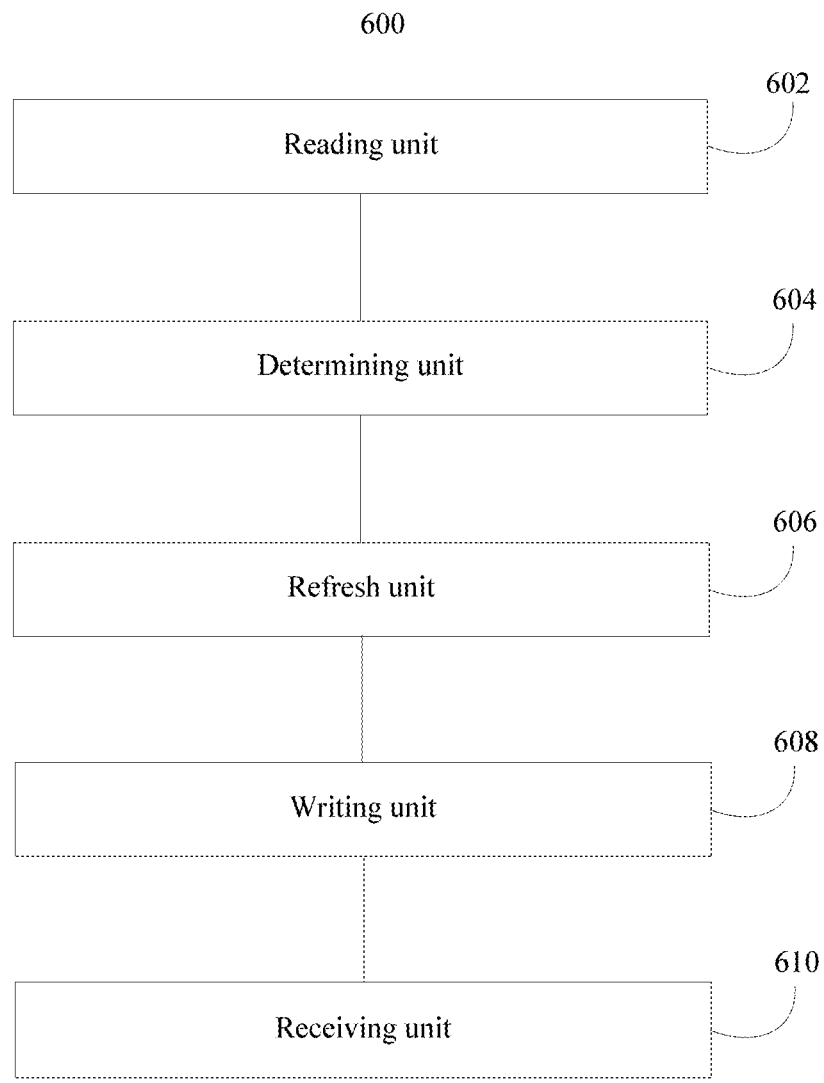
FIG. 6 is a schematic diagram of a logical structure of an apparatus for refreshing a flash memory device according to an embodiment of the present invention.

FIG. 6 is a schematic diagram of a logical structure of an apparatus 600 for refreshing a flash memory device according to an embodiment of the present invention. As shown in FIG. 6, the apparatus 600 includes a reading unit 602, a determining unit 604, and a refresh unit 606.

The reading unit 602 is configured to: read first data from a first flash memory block, and determine a bit error rate of the first data.

In a specific implementation process, the reading unit 602 may be implemented by using the processor 302 and the memory 304 shown in FIG. 3. More specifically, the processor 302 may execute the refresh module in the memory 304, to read the first data from the first flash memory block and determine the bit error rate of the first data.

The reading unit 602 is specifically configured to: read the first data from the first flash memory block, and decode the first data by using an error-correcting code, to obtain second data; and determine the bit error rate of the first data according to the first data and the second data.

The determining unit 604 is configured to: when the bit error rate is greater than a preset threshold, determine a refresh cycle of the first flash memory block according to a quantity of erase cycles of the first flash memory block.

In a specific implementation process, the determining unit 604 may be implemented by using the processor 302 and the memory 304 shown in FIG. 3. More specifically, the processor 302 may execute the refresh module in the memory 304, to determine the refresh cycle of the first flash memory block according to the quantity of erase cycles of the first flash memory block. There is a negative correlation between the refresh cycle of the first flash memory block and the quantity of erase cycles of the first flash memory block.

The refresh unit 606 is configured to perform a refresh operation on the first flash memory block according to the refresh cycle.

In a specific implementation process, the refresh unit 606 may be implemented by using the processor 302 and the memory 304 shown in FIG. 3. More specifically, the processor 302 may execute the refresh module in the memory 304, to perform the refresh operation on the first flash memory block according to the refresh cycle.

Optionally, that the refresh unit 606 is configured to perform a refresh operation on the first flash memory block according to the refresh cycle includes: the refresh unit 606 is configured to: when a storage time of data on any valid page in the first flash memory block reaches the refresh cycle, perform the refresh operation on the first flash memory block.

The apparatus 600 further includes a writing unit 608.

In a specific implementation process, the writing unit 608 may be implemented by using the processor 302 and the memory 304 shown in FIG. 3. More specifically, the processor 302 may execute the refresh module in the memory 304, to perform a write operation on a flash memory block of the flash memory device.

Optionally, that the refresh unit 606 is configured to perform a refresh operation on the first flash memory block includes: the refresh unit 606 is configured to: control the reading unit 602 to read third data from the first flash memory block, and control the reading unit 602 to decode the third data by using an error-correcting code, to obtain fourth data; and the refresh unit 606 is configured to: control the writing unit 608 to select a second flash memory block from the flash memory device, and control the writing unit 608 to write the fourth data into the second flash memory block.

Optionally, that the refresh unit 606 is configured to perform a refresh operation on the first flash memory block includes: the refresh unit 606 is configured to: control the reading unit 602 to read third data from the first flash memory block, and control the reading unit 602 to decode the third data by using an error-correcting code, to obtain fourth data; and the refresh unit 606 is configured to control the writing unit 608 to add a charge to a floating gate of a flash cell of the first flash memory block according to the fourth data.

The apparatus 600 further includes a receiving unit 610. The receiving unit 610 is configured to receive a write access request.

In a specific implementation process, the receiving unit 610 may be implemented by using the processor 302, the memory 304, and the communications interface 308 shown in FIG. 3. More specifically, the processor 302 may execute a communications module in the memory 304, so as to receive an access request from an operating system by using the communications interface 308.

Optionally, the writing unit 608 is further configured to: determine a third flash memory block according to a refresh cycle of a flash memory block, and write to-be-written data of the write access request into the third flash memory block, where the third flash memory block is a flash memory block that has a longest refresh cycle among available flash memory blocks.

Optionally, the writing unit 608 is further configured to: determine a fourth flash memory block according to an expected storage time of to-be-written data of the write access request, and write the to-be-written data into the fourth flash memory block, where there is a negative correlation between a refresh cycle of the fourth flash memory block and the expected storage time of the to-be-written data.

It should be understood that, for ease of description, the functions of the reading unit 602, the determining unit 604, the refresh unit 606, and the writing unit 608 in this embodiment of the present invention may be integrated in the refresh module shown in FIG. 3. The processor 302 executes different parts of the refresh module to implement different functions. However, in a specific implementation, the refresh module may be subdivided according to functions. This is not limited in this embodiment of the present invention.

This embodiment of the present invention is an apparatus embodiment of the storage controller. The feature descriptions in the embodiments in FIG. 4 and FIG. 5 are applicable to this embodiment of the present invention. Details are not described herein again.

In the several embodiments provided in this application, it should be understood that the disclosed system, device, and method may be implemented in other manners. For example, the described apparatus embodiment is merely an example. For example, the module division is merely logical function division and may be other division in actual implementation. For example, a plurality of modules or components may be combined or integrated into another system, or some features may be ignored or not performed. In addition, the displayed or discussed mutual couplings or direct couplings or communication connections may be implemented through some interfaces. The indirect couplings or communication connections between the apparatuses or modules may be implemented in electronic, mechanical, or other forms.

The modules described as separate parts may or may not be physically separate, and parts displayed as modules may or may not be physical modules, may be located in one position, or may be distributed on a plurality of network modules. Some or all the modules may be selected according to actual needs to achieve the objectives of the solutions of the embodiments.

In addition, functional modules in the embodiments of the present invention may be integrated into one processing module, or each of the modules may exist alone physically, or two or more modules are integrated into one module. The integrated module may be implemented in a form of hardware, or may be implemented in a form of hardware in addition to a software functional module.

When the foregoing integrated module is implemented in a form of a software functional module, the integrated unit may be stored in a computer-readable storage medium. The software functional module is stored in a storage medium and includes several instructions for instructing a computer device (which may be a personal computer, a server, or a network device) to perform some of the steps of the methods described in the embodiments of the present invention. The foregoing storage medium includes: any medium that can store program code, such as a removable hard disk, a read-only memory, a random access memory, a magnetic disk, or an optical disc.

Finally, it should be noted that the foregoing embodiments are merely intended for describing the technical solutions of the present invention, but not for limiting the present invention. Although the present invention is described in detail with reference to the foregoing embodiments, persons of ordinary skill in the art should understand that they may still make modifications to the technical solutions described in the foregoing embodiments or make equivalent replacements to some technical features thereof, without departing from the scope of the technical solutions of the embodiments of the present invention.

What is claimed is:

1. A method of refreshing a flash memory device having memory blocks including a first memory block and a second memory block, the method comprising:
    recording a first number of erase operations performed on the first memory block, and a second number of erase operations performed on the second memory block;
    detecting a first bit error rate of the first memory block, and a second bit error rate of the second memory block;
    setting a first refresh cycle for the first memory block based on the first number of erase operations and the first bit error rate;
    setting a second refresh cycle for the second memory block based on the second number of erase operations and the second bit error rate, the second refresh cycle being different from the first refresh cycle;
    determining that a storage time length of data stored in a page of the first memory block has reached the first refresh cycle;
    refreshing the first memory block according to the first refresh cycle; and
    refreshing the second memory block according to the second refresh cycle.

2. The method according to claim 1, further comprising:
    determining that the first bit error rate is greater than a preset threshold prior to setting the first refresh cycle for the first memory block.

3. The method according to claim 1, wherein the step of refreshing the first memory block comprises:
reading first data stored in the first block;
decoding the first data by using an error-correcting code to obtain second data;
selecting a third flash memory block of the flash memory device; and
writing the second data into the third memory block.

4. The method according to claim 1, wherein the step of refreshing the first memory block comprises:
reading first data stored in the first block;
decoding the first data by using an error-correcting code to obtain second data; and
supplementing a charge to a floating gate of a flash cell of the first flash memory block according to the second data.

5. The method according to claim 1, further comprising:
receiving a write access request containing to-be-written data;
selecting a third flash memory block in the flash memory device according to a to-be-stored time of the to-be-written data and refresh cycles of available memory blocks in the flash memory device; and
writing the to-be-written data into the third memory block.

6. The method according to claim 1, further comprising:
receiving a write access request containing to-be-written data;
identifying a third flash memory block in the flash memory device, wherein the third flash memory block has a longest refresh cycle among available flash memory blocks in the flash memory device; and
writing the to-be-written data into the third memory lock.

7. A flash memory controller of a flash memory device having memory blocks including a first memory block and a second memory block, comprising:
a memory configured to store instructions; and
a processor coupled to the memory and configured to execute the instructions to:
record a first number of erase operations performed on the first memory block, and a second number of erase operations performed on the second memory block;
detect a first bit error rate of the first memory block, and a second bit error rate of the second memory block;
set a first refresh cycle for the first memory block based on the first number of erase operations and the first bit error rate;
set a second refresh cycle for the second memory block based on the second number of erase operations and the second bit error rate, the second refresh cycle being different from the first refresh cycle;
determine that a storage time length of data stored on a page of the first memory block has reached the first refresh cycle;
refresh the first memory block according to the first refresh cycle; and
refresh the second memory block according to the second refresh cycle.

8. The flash memory controller according to claim 7, wherein the processor is configured to determine that the first bit error rate is greater than a preset threshold prior to setting the first refresh cycle.

9. The flash memory controller according to claim 7, wherein the processor is configured to refresh the first memory block by:
reading first data stored in the first memory block;
decoding the first data by using an error-correcting code to obtain second data;
selecting a third memory block in the flash memory device; and
writing the second data into the third memory block.

10. The flash memory controller according to claim 7, wherein the processor is configured to refresh the first memory block by:
reading first data stored in the first memory block;
decoding the first data by using an error-correcting code to obtain second data; and
supplementing a charge to a floating gate of a flash cell of the first flash memory block according to the second data.

11. The flash memory controller according to claim 7, wherein the processor is further configured to:
receive a write access request containing to-be-written data;
select a third memory block in the flash memory device according to a to-be-stored time of the to-be-written data and refresh cycles of available blocks in the flash memory device; and
write the to-be-written data into the third memory block.

12. The flash memory controller according to claim 7, wherein the processor is further configured to:
receive a write access request containing to-be-written data;
select a third memory block in the flash memory device, wherein the third flash memory block has a longest refresh cycle among available flash memory blocks in the flash memory device; and
write the to-be-written data into the third memory block.

13. A flash memory device, comprising:
a flash memory array having memory blocks including a first memory block and a second memory block; and
a flash memory controller coupled to the flash memory array and configured to:
record a first number of erase operations performed on the first memory block, and a second number of erase operations performed on the second memory block;
detect a first bit error rate of the first memory block, and a second bit error rate of the second memory block;
set a first refresh cycle for the first memory block based on the first number of erase operations and the first bit error rate;
set a second refresh cycle for the second memory block based on the second number of erase operations and the second bit error rate, the second refresh cycle being different from the first refresh cycle;
determine that a storage time length of data stored in a page of the first memory block has reached the first refresh cycle as a condition for refreshing the first memory block;
refresh the first memory block according to the first refresh cycle; and
refresh the second memory block according to the second refresh cycle.

14. The flash memory device according to claim 13, wherein the flash memory controller is configured to determine that the first bit error rate is greater than a preset threshold prior to setting the first refresh cycle for the first memory block.

15. The flash memory device according to claim 13, wherein the flash memory controller is configured to refresh the first memory block by:
reading first data stored in the first memory block;

decoding the first data by using an error-correcting code to obtain second data;
selecting a third flash memory block in the flash memory device; and
writing the second data into the third memory block.

16. The flash memory device according to claim 13, wherein the flash memory controller is configured to refresh the first memory block by:
reading first data stored in the first memory block;
decoding the first data by using an error-correcting code to obtain second data; and
supplementing a charge to a floating gate of a flash cell of the first flash memory block according to the second data.

17. The flash memory device according to claim 13, wherein the flash memory controller is further configured to:
receive a write access request containing to-be-written data;
determine a third memory block in the flash memory device according to a to-be-stored time of the to-be-written data and refresh cycles of available blocks in the flash memory device; and
write the to-be-written data into the third memory block.

* * * * *